(12) United States Patent
Olsen

(10) Patent No.: US 11,569,245 B2
(45) Date of Patent: Jan. 31, 2023

(54) GROWTH OF THIN OXIDE LAYER WITH AMORPHOUS SILICON AND OXIDATION

(71) Applicant: Applied Materials, Inc., Santa Clara, CA (US)

(72) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 17/076,807

(22) Filed: Oct. 22, 2020

(65) Prior Publication Data

US 2022/0130837 A1   Apr. 28, 2022

(51) Int. Cl.
*H01L 27/108* (2006.01)
*H01L 21/28* (2006.01)
*H01L 21/02* (2006.01)

(52) U.S. Cl.
CPC .. *H01L 27/10876* (2013.01); *H01L 21/02164* (2013.01); *H01L 21/02238* (2013.01); *H01L 21/02255* (2013.01); *H01L 21/28211* (2013.01); *H01L 27/10823* (2013.01)

(58) Field of Classification Search
CPC ......... H01L 27/10876; H01L 21/02164; H01L 21/02238; H01L 21/02255; H01L 21/28211; H01L 27/10823
See application file for complete search history.

(56) References Cited

U.S. PATENT DOCUMENTS

| 8,492,292 | B2 | 7/2013 | Yokota et al. |
| 2002/0137266 | A1 | 9/2002 | Moon et al. |
| 2014/0057455 | A1 | 2/2014 | Yokota et al. |
| 2017/0186642 | A1* | 6/2017 | Kim ................. H01L 21/02211 |
| 2018/0090368 | A1 | 3/2018 | Kim et al. |
| 2019/0348282 | A1* | 11/2019 | Takeshima ........ H01L 21/32138 |
| 2019/0371914 | A1* | 12/2019 | Yu ..................... H01L 21/28562 |
| 2020/0227433 | A1 | 7/2020 | Purayath |
| 2020/0402839 | A1* | 12/2020 | Im ....................... H01L 21/8238 |

FOREIGN PATENT DOCUMENTS

CN    103187354 A    7/2013

OTHER PUBLICATIONS

International Search Report dated Jan. 3, 2022 for Application No. PCT/US2021/050601.

* cited by examiner

*Primary Examiner* — Julia Slutsker
(74) *Attorney, Agent, or Firm* — Patterson & Sheridan, LLP

(57) ABSTRACT

A method for forming an oxide layer includes forming an interfacial layer on a substrate, forming an amorphous silicon layer on the interfacial layer, performing a direct oxidation process to selectively oxidize the formed amorphous silicon layer, and performing a thermal oxidation process to oxidize the formed amorphous silicon layer.

20 Claims, 6 Drawing Sheets

GROWTH OF THIN OXIDE LAYER WITH AMORPHOUS SILICON AND OXIDATION

BACKGROUND

Field

Embodiments described herein generally relate to semiconductor device fabrication, and more particularly, to methods of forming a high quality thin oxide layer in a high aspect ratio semiconductor structure.

Description of the Related Art

The production of silicon integrated circuits has placed difficult demands on fabrication processes to increase the number of devices while decreasing the minimum feature sizes on a chip. These demands have extended to fabrication processes including depositing layers onto difficult topologies while maintaining device reliability. For example, a recessed channel array transistor (RCAT) used in dynamic random access memory (DRAM) devices may have an aspect ratio of 10:1 or more and require a gate oxide layer that is thin and reliable.

Conventional methods of forming an oxide layer in such structures suffer from one or both of two issues. The first issue is high silicon consumption for thermal oxidation growth. That is, an oxide layer may not be formed thin for a high aspect ratio structure. The second issue is low quality of a formed oxide layer by deposition, which may include defects and traps within, thus leading to reduced device reliability.

Thus, there is a need for improved processes for forming a thin high quality oxide layer, minimizing silicon consumption and defects in the formed oxide layer.

SUMMARY

Embodiments of the present disclosure provide a method for forming an oxide layer. The method includes forming an interfacial layer on a substrate, forming an amorphous silicon layer on the interfacial layer, performing a direct oxidation process to selectively oxidize the formed amorphous silicon layer, and performing a thermal oxidation process to oxidize the formed amorphous silicon layer.

Embodiments of the present disclosure also provide a method for forming an oxide layer. The method includes forming an amorphous silicon layer on a substrate, and performing a thermal oxidation process to oxidize the formed amorphous silicon layer.

Embodiments of the present disclosure further provide a method for forming an oxide layer. The method includes forming of an amorphous silicon layer on a silicon substrate by exposing the silicon substrate to a silicon precursor in an atomic layer deposition (ALD) process or in a chemical vapor deposition (CVD) process, and performing a thermal oxidation process to oxidize the formed amorphous silicon layer to form an oxide layer on the silicon substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are directed to methods of forming a high quality thin oxide layer in a semiconductor device, such as a recessed channel array transistor (RCAT) used in a dynamic random access memory (DRAM) device, and a thin nanowire field-effect-transistor (FET). A thin oxide layer that may be used as a gate oxide layer in such devices may be formed by first depositing an amorphous silicon on a substrate and then oxidizing the amorphous silicon by a direct plasma oxidation process and a thermal oxidation process.

The methods described herein for forming an oxide layer may reduce silicon consumption and increase quality of the formed oxide layer. The methods described herein also provide the capability of selectively tuning a thickness of an oxide layer. For example, an oxide layer formed in a concave shaped feature in the substrate may be thickened at a bottom of the concave shaped feature as desired, by directing plasma ions to the bottom of the concave shaped feature.

Figure 1:
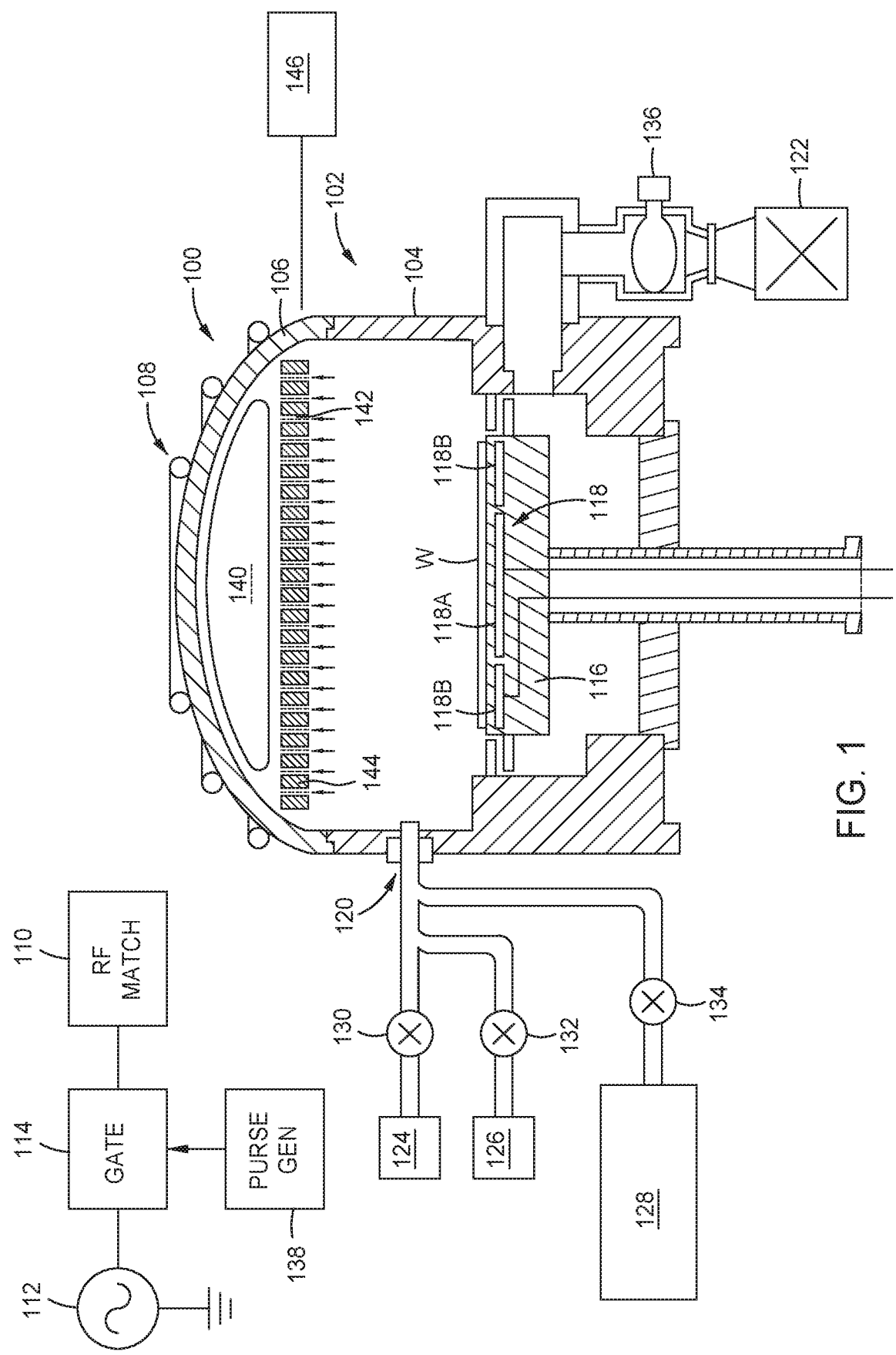
FIG. 1 is a schematic view of a substrate processing system according to one embodiment.

FIG. 1 schematically illustrates a substrate processing system 100 that may be used to perform aspects of the methods described herein. The substrate processing system 100 may be a Decoupled Plasma Oxidation (DPO) reactor available from Applied Materials, Inc., of Santa Clara, Calif.

The substrate processing system 100 includes a chamber 102 having a cylindrical side wall 104 and a ceiling 106 which may be either dome-shaped (as shown in FIG. 1), flat, or other geometry. The substrate processing system 100 may provide a low ion energy plasma via an inductively coupled plasma (ICP) source power applicator driven by a pulsed or continuous wave (CW) RF power generator. The ICP source power applicator comprises a coil antenna 108 disposed over the ceiling 106 and coupled through an impedance match network 110 to an RF power source including an RF power generator 112 and a gate 114 at the output of the RF power generator 112 controlled by a pulse signal having a selected duty cycle. It is contemplated that other low ion energy producing plasma source power applicators may be utilized as well, such as remote RF or microwave plasma sources. Alternatively, the power generator can be a pulsed DC generator. The substrate processing system 100 may include a transformer coupled plasma (TCP) source or a microwave plasma source.

The substrate processing system 100 further includes a substrate support pedestal 116, such as an electrostatic chuck or other suitable substrate support, for holding a substrate W, for example a 200 or 300 mm semiconductor wafer or the like. The substrate support pedestal 116 typically includes a heating apparatus, such as a heater 118 beneath the top surface of the substrate support pedestal 116. The heater 118 may be a single or multiple zone heater, such as a dual radial zone heater having radially inner and outer heating elements 118A, 118B, as depicted in FIG. 1.

The substrate processing system 100 further includes a gas injection system 120 and a vacuum pump 122 coupled to the interior of the chamber 102. The gas injection system 120 is supplied to one or more process gas sources, for example, an oxidizing gas container 124 for supplying oxidizing gases including $O_2$, $N_2O$, NO, $NO_2$, $H_2O$, $H_2$, and $H_2O_2$, a reducing gas container 126 for supplying reducing gases such as hydrogen, or other process gas source as required for a particular application, for example, gases such as He, Ar or nitridizing gases such as $N_2$. Flow control valves 130, 132, and 134 respectively coupled to the gas sources (e.g., the oxidizing gas container 124, the reducing gas container 126, etching gas containers 128, and the like) may be utilized to selectively provide process gases or process gas mixtures to the interior of the chamber 102 during processing. Other gas sources (not shown) for providing additional gases, such as inert gases (helium, argon, or the like), gaseous mixtures, or the like, may also be provided. The chamber pressure may be controlled by a throttle valve 136 of the vacuum pump 122.

The duty cycle of the pulsed RF power output at the gate 114 may be controlled by controlling the duty cycle of a pulse generator 138 whose output is coupled to the gate 114. Plasma is generated in an ion generation region 140 corresponding to a volume under the ceiling 106 surrounded by the coil antenna 108. As the plasma is formed in an upper region of the chamber 102 at a distance from the substrate W, the plasma is referred to as a quasi-remote plasma (e.g., the plasma has benefits of remote plasma formation, but is formed within same process chamber 102 as the substrate W.)

In operation, the substrate processing system 100 may be employed to carry out oxidation processes in accordance with embodiments of the present invention. The plasma is formed in the ion generation region 140 of the chamber 102 via inductive coupling of RF energy from the coil antenna 108 disposed over the ceiling 106, providing a low ion energy (e.g., less than about 5 eV for pulsed plasmas and less than 25 eV for CW plasmas).

In some embodiments, about 25 to 5000 watts of power may be provided to the coil antenna 108 at a suitable frequency to form a plasma (for example, in the MHz or GHz range, or about 13.56 MHz or greater). The power may be provided in a continuous wave or pulsed mode with duty cycles of between about 2 to 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the on generation region 140 loosely corresponding to the volume enclosed by the coil antenna 108. The ion generation region 140 is elevated a significant distance $L_D$ above the substrate W. Plasma generated in the ion generation region 140 near the ceiling 106 during the on time drifts at an average velocity $V_D$ toward the substrate W during the "off" time. During each "off" time, the fastest electrons diffuse to the chamber walls, allowing the plasma to cool. The most energetic electrons diffuse to the chamber walls at a much faster velocity than the plasma ion drift velocity $V_D$. Therefore, during the "off" time, the plasma on energy decreases significantly before the ions reach the substrate W. During the next "on" time, more plasma is produced in the ion generation region 140, and the entire cycle repeats itself. As a result, the energy of the plasma ions reaching the substrate W is significantly reduced. At the lower range of chamber pressure, namely around 10 mT and below, the plasma energy of the pulsed RF case is greatly reduced from that of the continuous RF case.

The "off" time of the pulsed RF power waveform and the distance $L_D$ between the ion generation region 140 and the substrate W must both be sufficient to allow plasma generated in the ion generation region 140 to lose a sufficient amount of its energy so that it causes little or no ion bombardment damage or defects upon reaching the substrate W. Specifically, the "off" time is defined by a pulse frequency between about 2 and 30 kHz, or at about 10 kHz, and an "on" duty cycle between about 5% and 20%. Thus, in some embodiments, the "on" interval may last between about 5 microseconds and about 50 microseconds, or about 20 microseconds and the "off" interval may last between about 50 microseconds and about 95 microseconds, or about 80 microseconds. The "off" time is important to allow discharging and neutralization of charge species at wafer features, so ions can travel further and not be deflected.

The plasma generated may be formed in a low pressure process, thereby reducing the likelihood of contamination induced defects. For example, in some embodiments, the chamber 102 may be maintained at a pressure of between about 2 mTorr and about 500 mTorr. Moreover, ion collision-induced defects, such as cupping, that would be expected at such a low chamber pressure of less than about 10 mTorr may be limited or prevented by using the quasi-remote plasma source and, optionally, by pulsing the plasma source power as described above.

The substrate may be maintained at about room temperature (about 22 degrees Celsius), or at a temperature of between about 20-750 degrees Celsius, or less than about 700 degrees Celsius, or less than about 600 degrees Celsius. In some embodiments, higher temperatures may be utilized as well, such as less than about 800 degrees Celsius in remote plasma oxidation processes.

Figure 2:
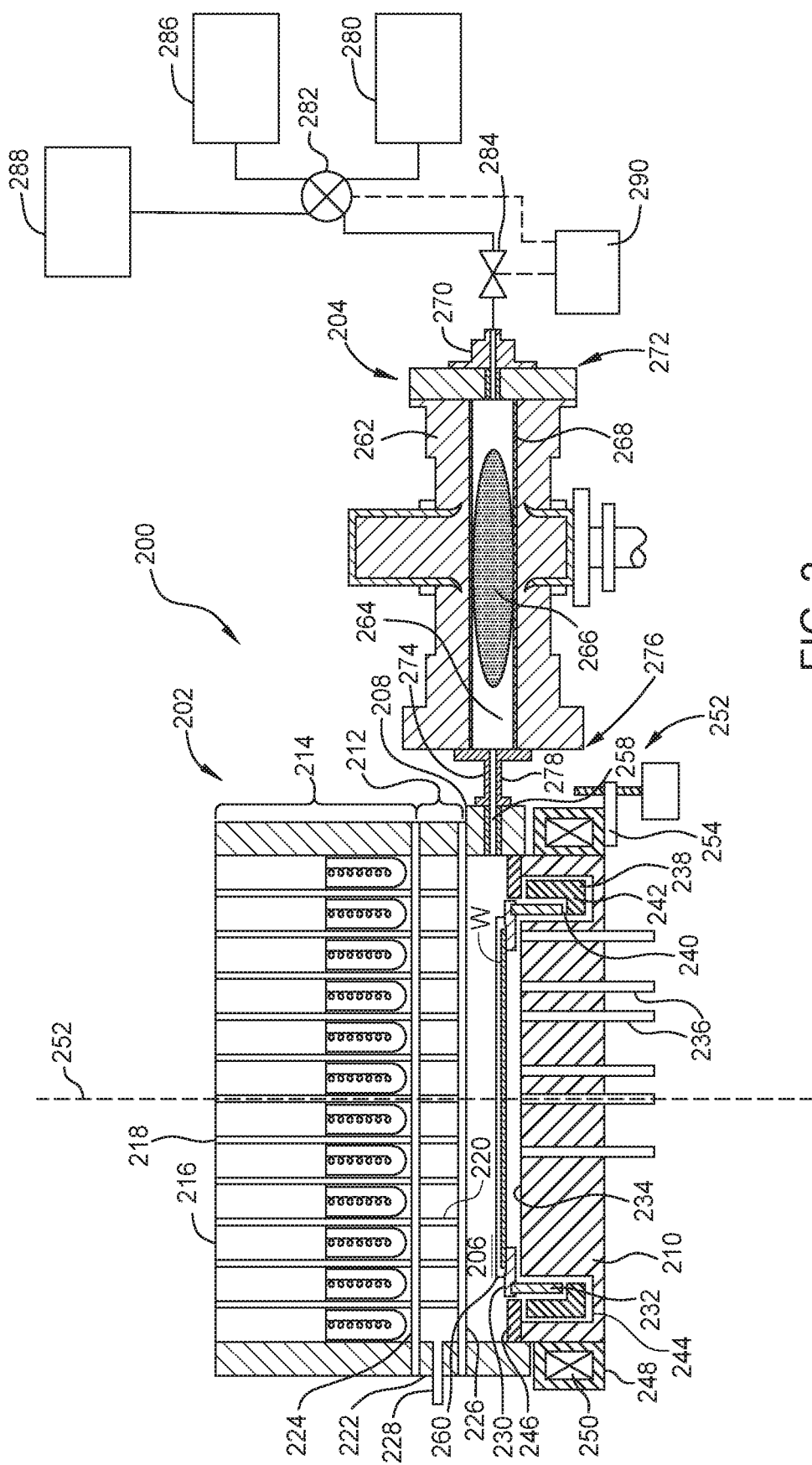
FIG. 2 is a schematic view of a substrate processing system according to one embodiment.

FIG. 2 schematically illustrates a substrate processing system 200 that may be used to perform aspects of the methods described herein. The substrate processing system 200 may be a rapid thermal processing (RTP) apparatus, such as, but not limited to, RTP CENTURA® available from Applied Materials, Inc., of Santa Clara, Calif. Other types of thermal reactors, such as EPI CENTURA® available from Applied Materials, Inc., of Santa Clara, Calif., may be substituted for the RTP apparatus. Other suitable plasma reactors, including Remote Plasma Oxidation (RPO) reactors available from Applied Materials, Inc., of Santa Clara, Calif., may also be utilized.

The substrate processing system 200 includes a thermal processing chamber 202 and a precursor activator 204 that couples to the thermal processing chamber 202 and is used to remotely provide radicals of a plasma to a processing region 206 of the thermal processing chamber 202. The precursor activator 204 can also be used to provide an activated plasma gas mixture, for example by applying energy to a gas that makes a high radical rich mixture with negligible ions. The processing region 206 is enclosed by one or more sidewalls 208 (e.g., four sidewalls) and a base 210. The upper portion of the sidewall 208 may be sealed to a window assembly 212 (e.g., using "O" rings). A radiant energy assembly 212 is positioned over and coupled to window assembly 212. The radiant energy assembly 214 has a plurality of lamps 216, which may be tungsten halogen lamps, each mounted into a receptacle 218 and positioned to emit electromagnetic radiation into the processing region 206. The window assembly 212 of FIG. 2 has a plurality of light pipes 220, but the window assembly 212 may just have a flat, solid window with no light pipes. The window assembly 212 has an outer wall 222 (e.g., a cylindrical outer wall) that forms a rim enclosing the window assembly 212 around a circumference thereof. The window assembly 212 also has a first window 224 covering a first end of the plurality of light pipes 220 and a second window 226 covering a second end of the plurality of light pipes 220, opposite the first end. The first window 224 and second window 226 extend to, and engage with, the outer wall 222 of the window assembly 212 to enclose and seal the interior of the window assembly 212, which includes the plurality of light pipes 220. In such cases, when light pipes are used, a vacuum can be produced in the plurality of light pipes 220 by applying vacuum through a conduit 228 through the outer wall 222 to one of the plurality of light pipes 220, which is in turn fluidly connected to the rest of the light pipes.

A substrate W is supported in the thermal processing chamber 202 by a support ring 230 within the processing region 206. The support ring 230 is mounted on a rotatable cylinder 232. By rotating the rotatable cylinder 232, the support ring 230 and substrate W are caused to rotate during processing. The base 210 of the thermal processing chamber 202 has a reflective surface 234 for reflecting energy onto the backside of the substrate W during processing. Alternatively, a separate reflector (not shown) can be positioned between the base 210 of the thermal processing chamber 202 and the support ring 230. The thermal processing chamber 202 may include a plurality of temperature probes 236 disposed through the base 210 of the thermal processing chamber 202 to detect the temperature of the substrate W. In the event a separate reflector is used, as described above, the temperature probes 236 are also disposed through the separate reflector for optical access to electromagnetic radiation coming from the substrate W.

The rotatable cylinder 232 is supported by a magnetic rotor 238, which is a cylindrical member having a ledge 240 on which the rotatable cylinder 232 rests when both members are installed in the thermal processing chamber 202. The magnetic rotor 238 has a plurality of magnets in a magnet region 242 below the ledge 240. The magnetic rotor 238 is disposed in an annular well 244 located at a peripheral region of the thermal processing chamber 202 along the base 210. A cover 246 rests on a peripheral portion of the base 210 and extends over the annular well 244 toward the rotatable cylinder 232 and support ring 230, leaving a tolerance gap between the cover 246 and the rotatable cylinder 232 and/or the support ring 230. The cover 246 generally protects the magnetic rotor 238 from exposure to process conditions in the processing region 206.

The magnetic rotor 238 is rotated by magnetic energy from a magnetic stator 248 disposed around the base 210. The magnetic stator 248 has a plurality of electromagnets 250 that, during processing of the substrate W, are powered according to a rotating pattern to form a rotating magnetic field that provides magnetic energy to rotate the magnetic rotor 238. The magnetic stator 248 is coupled to a linear actuator 252 by a support 254. Operating the linear actuator 252 moves the magnetic stator 248 along an axis 256 of the thermal processing chamber 202, which in turn moves the magnetic rotor 238, the rotatable cylinder 232, the support ring 230, and the substrate W along the axis 256.

Processing gas is provided to the thermal processing chamber 202 through a chamber inlet 258, and exhausts through a chamber outlet oriented out of the page and generally along the same plane as the chamber inlet 258 and the support ring 230 (not shown in FIG. 2). Substrates enter and exit the thermal processing chamber 202 through an access port 260 formed in the sidewall 208 and shown at the rear in FIG. 2.

The precursor activator 204 has a body 262 surrounding an interior space 264 where a plasma 266 of ions, radicals, and electrons can be formed. A liner 268 made of quartz or sapphire protects the body 262 from chemical attack by the plasma. The interior space 264 preferably does not have any electrical potential gradient present that might attract charged particles, e.g., ions. A gas inlet 270 is disposed at a first end 272 of the body 262 and opposite from a gas outlet 274 that is located at a second end 276 of the body 262. When the precursor activator 204 is coupled to the thermal processing chamber 202, the gas outlet 274 is in fluid communication with the thermal processing chamber 202 through a delivery line 278 to chamber inlet 258, such that radicals of the plasma 266 generated within the interior space 264 are supplied to the processing region 206 of the thermal processing chamber 202. The gas outlet 274 may have a diameter larger than the gas inlet 270 to allow the excited radicals to be efficiently discharged at a targeted flow rate, and to minimize the contact between the radicals and the liner 268. If targeted, a separate orifice may be inserted within the liner 268 at the gas outlet 274 to reduce an inner dimension of the interior space 264 at the gas outlet 274. The diameter of the gas outlet 274 (or orifice, if used) can be selected to provide a pressure differential between the processing region 206 and the precursor activator 204. The pressure differential may be selected to yield a composition of ions, radicals, and molecules flowing into the thermal processing chamber 202 that is suitable to processes being performed in the thermal processing chamber 202.

To provide gas for plasma processing, a first gas source 280 is coupled to the gas inlet 270 via a first input of a four-way valve 282 and a valve 284 used to control the flow rate of gas released from the first gas source 280. A second input of the four-way valve 282 may be coupled to a second gas source 286. A third input of the four-way valve may be coupled to a third gas source 288. Each of the first gas source 280, the second gas source 286, and the third gas source 288 may be, or include, one or more of a nitrogen-containing gas, an oxygen-containing gas, a silicon-containing gas, a hydrogen-containing gas, or a plasma forming gas such as argon or helium. A flow controller 290 is connected to the four-way valve 282 to switch the valve between its different positions, depending upon which process is to be carried out. The flow controller 290 also controls switching of the four-way valve 282.

In some implementations, a second hydrogen gas source (not shown) is fluidly coupled with the thermal processing chamber 202. The second hydrogen gas source delivers hydrogen gas to the processing region 206 where the hydrogen gas is activated by the remote plasma comprising oxygen and argon delivered from the precursor activator 204 to the processing region 206. In some implementations where a high percentage of hydrogen gas is targeted, hydrogen gas may be supplied to the processing region 206 through both the third gas source 288 and the second hydrogen gas source.

In some implementations, a second argon gas source (not shown) is coupled with the thermal processing chamber 202. The second argon gas source delivers argon gas to the processing region 206 where the argon gas is activated by the remote plasma delivered from the precursor activator 204 to the processing region 206. In some implementations where a high percentage of argon gas is targeted, argon gas may be supplied to the processing region 206 through both the second gas source 286 and the second argon gas source.

Figure 3:
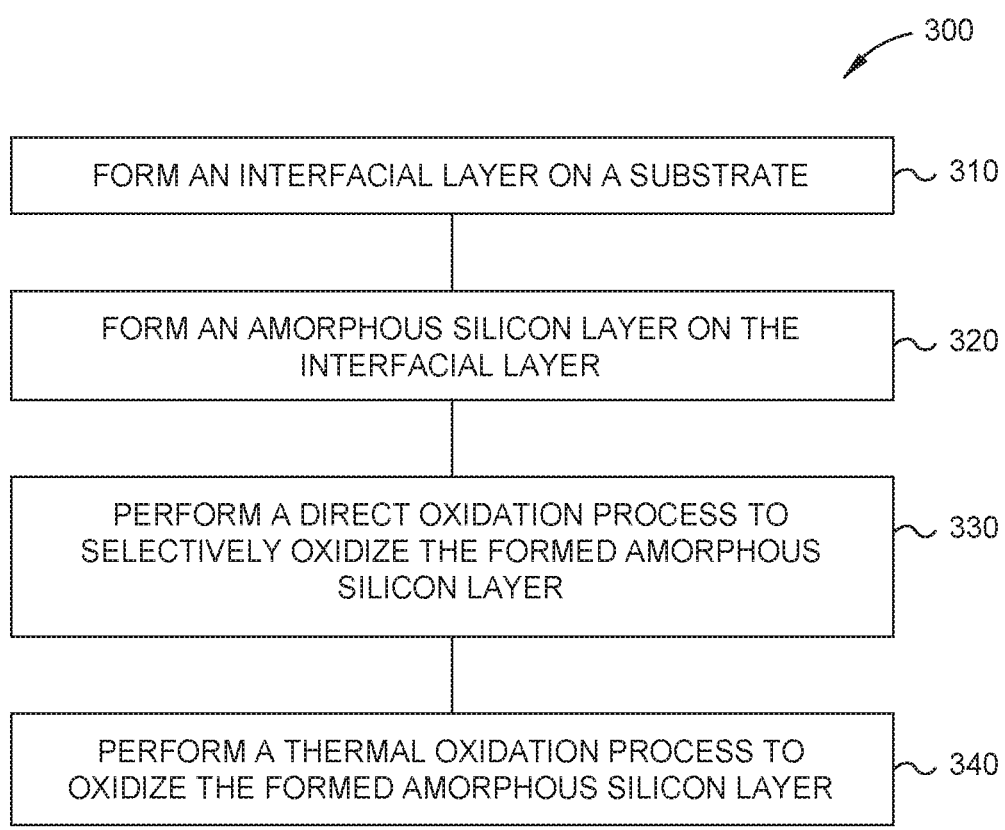
FIG. 3 is a process flow diagram of a method of forming an oxide layer in a semiconductor structure according to one embodiment.
Figure 4A:
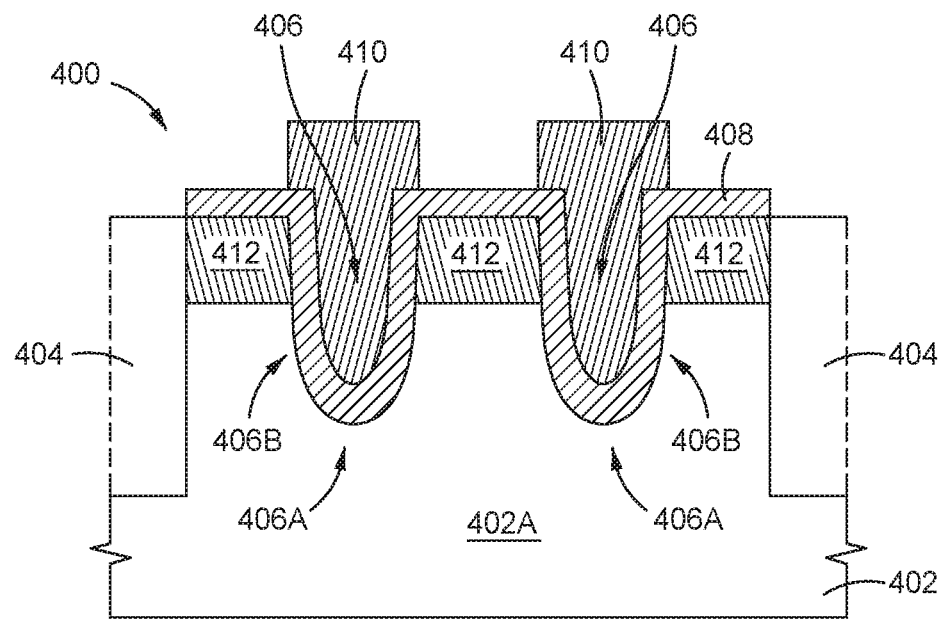
FIGS. 4A, 4B, 4C, 4D, and 4E are schematic views of a recessed channel array transistor (RCAT) structure according to one embodiment.

FIG. 3 is a process flow diagram of a method 300 of forming an oxide layer in a semiconductor structure, such as a recessed channel array transistor (RCAT) structure 400 shown in FIG. 4A or any subset of the RCAT structure 400, according to one or more implementation of the present disclosure. FIGS. 4B, 4C, 4D, and 4E are cross-sectional views of a portion of the RCAT structure 400 corresponding to various stages of the method 300. The RCAT structure 400 may be used in a dynamic random access memory (DRAM) device. Additionally, the method 300 may be used to form RCAT structures having different configurations or other semiconductor devices, such as nanowires, that require a high-quality thin oxide layer. Further, it should also be understood that the operations depicted in FIG. 3 may be performed simultaneously and/or in a different order than the order depicted in FIG. 3.

The RCAT structure 400 may include a substrate 402 having an isolation layer pattern 404 formed thereon. In some implementations, the substrate 402 may have a substantially planar surface, an uneven surface, or a substantially planar surface having a structure formed thereon. The substrate 402 may be a material such as crystalline silicon (e.g., Si<100> or Si<111>), doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 402 may have various shapes and dimensions, such as 200 mm or 300 mm diameter wafers and rectangular or square panels. Unless otherwise noted, implementations and examples described herein refer to substrates having a 300 mm diameter. In some implementations, the substrate 402 may be a crystalline silicon substrate (e.g., monocrystalline silicon or polycrystalline silicon).

The isolation layer pattern 404 defines an active region 402A of the substrate 402. The isolation layer pattern 404 may be formed by a shallow trench isolation process. At an upper surface of the active region 402A, one or more trenches 406 are formed. The trenches 406 may have a width of between about 15 nm and 60 nm, a depth of between about 200 nm and about 400 nm, and thus an aspect ratio of between about 8:1 and about 10:1.

On the upper surface of the substrate 402 and an inner surface of the trenches 406, a gate oxide layer 408 formed. On the gate oxide layer 408, gate electrodes 410 are formed. At both sides of the gate electrodes 410, source/drain regions 412 may be formed by impurity ion implantation processes. The source/drain regions 412 are electrically separated from the gate electrodes 410 by the gate oxide layer 408.

In a conventional method of forming the gate oxide layer 408 by a thermal oxidation process that converts silicon in the substrate 402 into silicon oxide, an oxidation reaction at a bottom 406A of the trench 406 may become diminished due to stress, and thus a thickness of the gate oxide layer 408 on the bottom 406A of the trench 406 may be less than a thickness of the gate oxide layer 408 on a sidewall 406B of the trench 406. Thus, a leakage current through the bottom 406A of the trenches 406 may be increased. This thinning of the gate oxide layer 408 (referred to as a "geometric thinning") may be overcome by a direct plasma oxidation process, in which plasma ions are directed to the bottom 406A of the trench 406, thus increasing an influx of an oxidizing agent.

Furthermore, the gate oxide layer 408 formed by a thermal oxidation process and a direct plasma oxidation process may have a thickness of between about 4 nm and about 8 nm, for example, about 6 nm (i.e., a width of the trench 406 is reduced by about 12 nm), and may not be formed thinner than about 4 nm due to direct tunneling gate leakage. In addition, some silicon may be lost at edges of the trenches 406, thus forming an undesired contact in the RCAT structure 400 and reducing device reliability. In smaller size features having a high aspect ratio and a high device density, such as the modern 14/10/7 nm nodes, a thinner gate oxide layer 408 having a width of between about 6 nm and about 7 nm is required to avoid a leak current.

In another conventional method of forming the gate oxide layer 408 by depositing silicon oxide by an ALD or a CVD process using a silicon containing precursor and an oxygen containing precursor in gas phases, a thickness of the gate oxide layer 408 may be reduced to between about 30 Å and about 60 Å, for example, about 40 Å. Furthermore, due to the ability of conformal deposition of materials of an ALD or a CVD process, the geometric thinning of the gate oxide layer 408 at the bottom 406A of the trench 406 may not occur. However, the deposited silicon oxide may include stoichiometric and structural defects (due to interruption of the tetrahedral crystalline structures of the silicon oxide formed by an ALD or a CVD process), border traps at a distance of between about 10 Å and about 15 Å from the interface with the substrate 402, and interface traps at the interface (e.g., within about 5 Å from the interface), leading to reduced device reliability of the RCAT structure 400. The deposited silicon oxide may be treated by a direct plasma oxidation process and/or a post annealing process to reduce the defects in the deposited silicon oxide. However, the treatment is effective only at a top surface of the deposited silicon oxide to a depth of between about 10 Å and about 30 Å, thus the device reliability may not be significantly improved.

In the embodiments described herein, the gate oxide layer 408 is formed by first depositing an amorphous silicon layer on the substrate 402, and then oxidizing the deposited amorphous silicon by a direct plasma oxidation process and a thermal oxidation process. The method 300 described herein includes deposition of amorphous silicon that provides a sacrificial Si source for thermal oxidation growth and increases the average distance between neighboring devices. Thus, silicon consumption for forming the gate oxide layer 408 may be reduced. Furthermore, the method 300 does not include deposition of silicon oxide, and thus the formed gate oxide layer 408 is free from defects and traps.

Figure 4B:
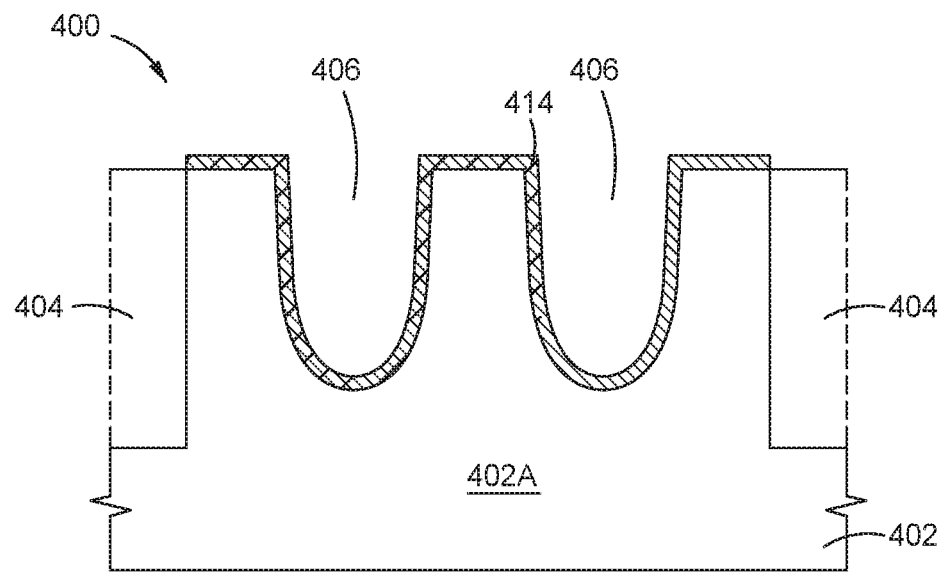

The method 300 begins in block 310 by forming an interfacial layer 414 onto the exposed surface of the substrate 402 to fill, or at least partially fill the trench 406, as shown in FIG. 4B. The interfacial layer 414 may be formed of silicon oxide ($SiO_2$) having a thickness of between about 2 Å and about 10 Å, for example, about 5 Å, corresponding to one or more monolayers of silicon oxide by thermal oxidation growth. The interfacial layer 414 may prevent deposited silicon from crystalizing in the subsequent step of the method 300, and thus amorphous silicon may formed.

Figure 4C:
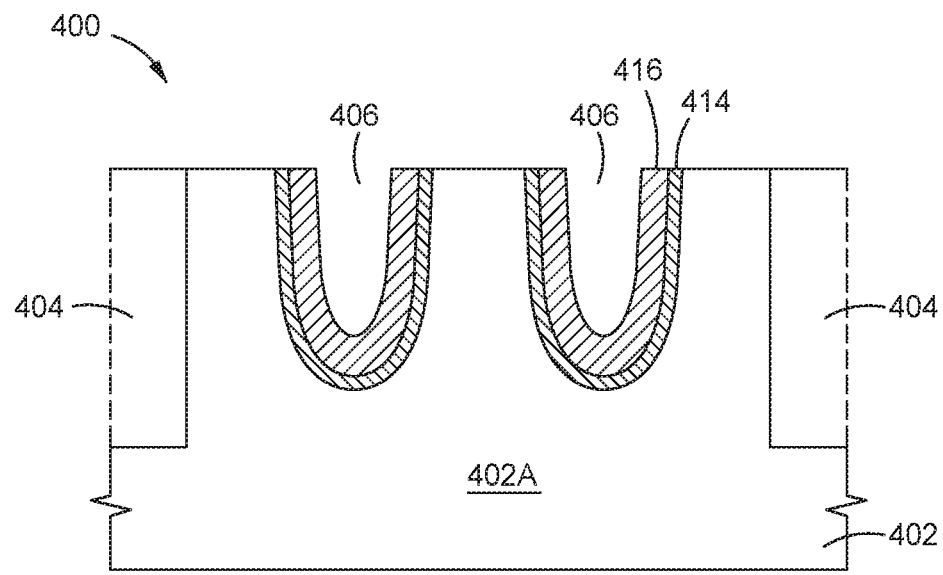

In block 320, amorphous silicon, such as hydrogenated amorphous silicon (a-Si:H), is conformally deposited on the interfacial layer 414 by an ALD process or a CVD process, in which the substrate 401 having the interfacial layer 414 formed thereon is exposed to a silicon precursor. As shown in FIG. 4C, an amorphous silicon layer 416 is conformally formed on the interfacial layer 414. Due to the nature of an ALD or a CVD process, the amorphous silicon layer 416 has a thickness at the bottom 406A that is substantially the same as a thickness on the sidewalls 406B of the trench 406. The thickness of the amorphous silicon layer 416 may be between about 20 Å and about 35 Å.

Suitable silicon precursors include, but are not limited to, poly-silanes ($Si_xH_y$). For example, poly-silanes include disilane ($Si_2H_6$), trisilane ($Si_3H_8$), tetrasilane ($Si_4H_{10}$), iso-tetrasilane, neopentasilane ($Si_5H_{12}$), cyclopentasilane ($Si_5H_{10}$), hexasilane ($Si_6H_{14}$), cyclohexasilane ($Si_6H_{12}$) or, in general, $Si_xH_y$ with x=2 or more, and combinations thereof.

Figure 4D:
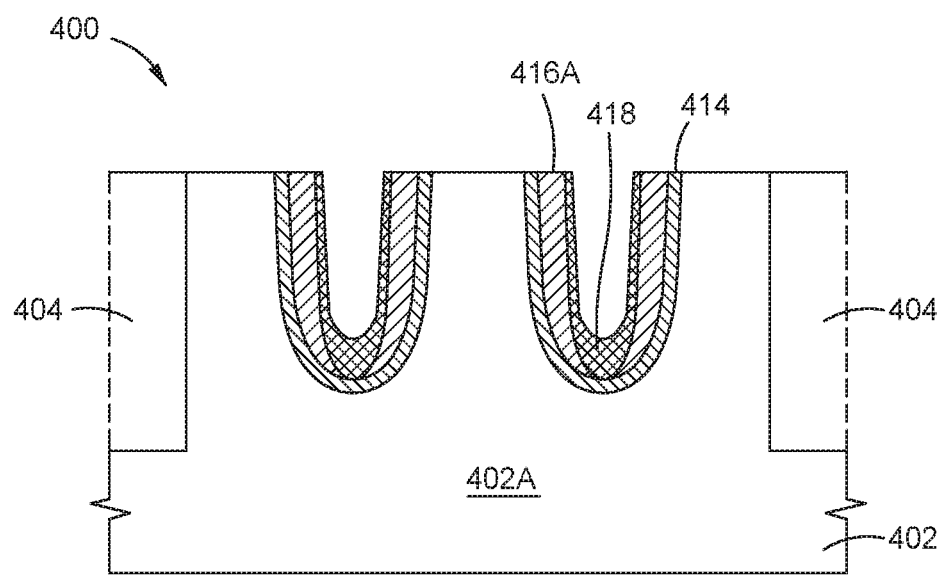
Figure 4E:
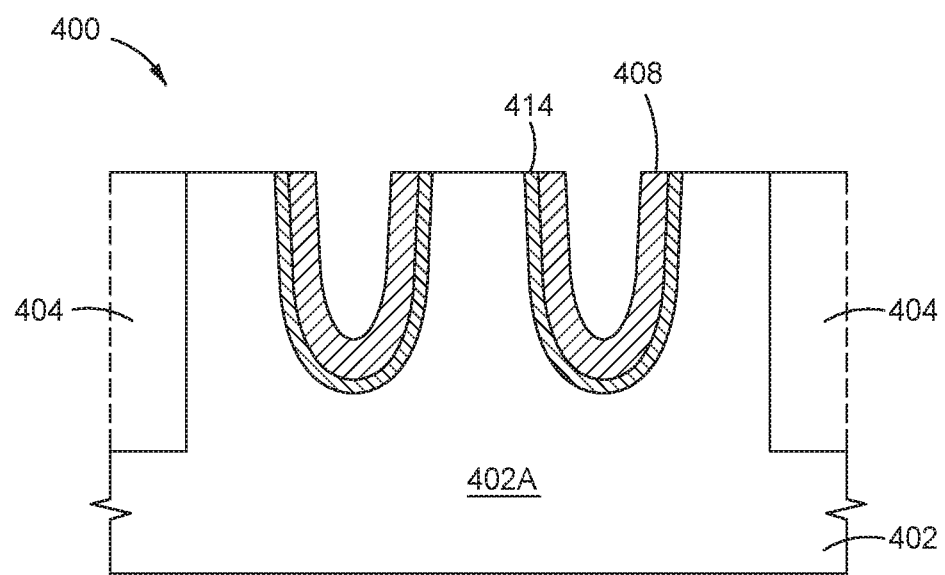

In block 330, the amorphous silicon layer 416 is oxidized to form a first oxide layer 418 that is thick on the bottom 406A of the trench 406 by a direct plasma oxidation process in a processing system, such as the substrate processing system 100 shown in FIG. 1. In a direct plasma oxidation process, oxygen plasma ions are directed to the bottom 406A of the trench 406, and thus the oxidation of the amorphous silicon layer 416 occurs preferentially to the bottom 406A of the trench 406, as shown in FIG. 4D. In some embodiments, the direct plasma oxidation process may use an oxidizing agent including oxygen ($O_2$), nitric oxide (NO), nitrous oxide ($N_2O$), or the like. These may be used alone or in a combination thereof. Further, the direct plasma oxidation process may use a source gas for generating plasma including helium (He), argon (Ar), and/or xenon (Xe), among others. These may be used alone or in a combination thereof. In some embodiments, the direct plasma oxidation process may allow an oxidation reaction at a temperature above about 400° C. to ensure high quality of the oxidized silicon. In some embodiments, oxygen plasma ions may be directed to another selected portion of the substrate 402, to selectively thicken the first oxide layer 418 at the selected portion of the substrate 402.

In some embodiments, the direct plasma oxidation process may be performed under a pressure of between about 5 mTorr and about 100 mTorr. The pressure may control an influx of the oxidizing agent introduced into the trench 406. Particularly, the influx of the oxidizing agent introduced onto the bottom 406A of the trench 406 may be reduced in proportional to the pressure drop in the direct plasma oxidation process. The influx of the oxidizing agent onto the bottom 406A of the trench 406 may be controlled also by applying a bias during the direct plasma oxidation process. Thus, a thickness of the first oxide layer 418 at the bottom 406A of the trench 406 may be controlled and adjusted as desired.

In some embodiments, the first oxide layer 418 consumes the amorphous silicon layer 416 to a depth of between about 2 nm and about 6 nm, for example, about 4 nm, on the bottom 406A of the trench 406 and a depth of between about 1 nm and about 3 nm on the sidewalls 406B of the trench 406.

In block 340, the remaining 416A of the amorphous silicon layer 416 on the sidewalls 406B of the trench 406 is oxidized by a thermal oxidation process in a processing system, such as the substrate processing system 200. The thermal oxidation process may be performed using a thermal radical oxidation with 10 Torr low pressure $H_2+O_2$ combustion process or a plasma source, for example, a remote plasma source such as the precursor activator 204 in the substrate processing system 200, to provide oxygen radicals (O*). In a thermal oxidation process, the oxidation of the amorphous silicon layer 416 occurs preferentially to the sidewalls 406B of the trench 406, and therefore the combination a direct plasma oxidation process in block 340 and a thermal oxidation process in block 350 leads to formation of the gate oxide layer 408 having a thickness on the bottom 406A that is the same as a thickness on the sidewalls 406B of the trench 406.

In some embodiments, the thermal treatment process may be performed at a temperature greater than that of the direct plasma oxidation process. For example, the thermal treatment process may be performed at a temperature of between about 700° C. and about 1050° C.

In the embodiments described herein, the RCAT structure 400 having the trenches 406 (i.e., concave shaped) is used as an example structure that may benefit from the method 300 for forming a high quality thin oxide layer. The method 300 may also be used to form a high quality thin oxide layer in a structure having convex shaped features (e.g., protrusion) or flat features, such as in a thin nanowire field-effect-transistor (FET). In such cases, the geometric thinning of the oxide layer may not occur, and thus a high quality thin oxide layer may be formed without the direct plasma oxidation process in block 330.

In the embodiments described herein methods of forming a high quality thin oxide layer in a semiconductor device, such as a recessed channel array transistor (RCAT) used in a dynamic random access memory (DRAM) device, and a thin nanowire thin nanowire field-effect-transistor (FET), are provided. In the methods described herein, a thin oxide layer may be formed by first depositing an amorphous silicon on a substrate and then oxidizing the amorphous silicon by a direct plasma oxidation process and a thermal oxidation process. The methods described herein for forming an oxide layer may reduce silicon consumption and increase quality of the formed oxide layer. The methods described herein also provide the capability of tuning a thickness of an oxide layer at a selected portion of the substrate.

While the foregoing is directed to embodiments of the present disclosure, other and further embodiments of the disclosure may be devised without departing from the basic scope thereof, and the scope thereof is determined by the claims that follow.

The invention claimed is:
1. A method for forming an oxide layer, comprising:
   forming an interfacial layer on a substrate;
   forming an amorphous silicon layer on the interfacial layer;
   performing a direct oxidation process to directly and selectively oxidize only a portion of the formed amorphous silicon layer; and
   performing a thermal oxidation process to oxidize a remaining non-oxidized portion of the formed amorphous silicon layer.
2. The method of claim 1, wherein
   the substrate comprises crystalline silicon, and
   the substrate includes concave shaped features and the oxide layer is formed within the concave shaped features.

3. The method of claim 1, wherein the interfacial layer comprises silicon oxide and has a thickness of between 2 Å and 20 Å.

4. The method of claim 1, wherein the forming of the amorphous silicon layer comprises exposing the substrate to a silicon precursor in an atomic layer deposition (ALD) process or in a chemical vapor deposition (CVD) process.

5. The method of claim 1, wherein the amorphous silicon layer has a thickness of between 10 Å and 50 Å.

6. The method of claim 1, wherein the direct oxidation process comprises directing oxygen plasma ions to a selected portion of the substrate.

7. The method of claim 1, wherein the thermal oxidation process comprises exposing the substrate to oxygen radicals.

8. A method for forming an oxide layer, comprising:
forming an amorphous silicon layer on a substrate;
performing a direct oxidation process to directly and selectively oxidize only a portion of the formed amorphous silicon layer; and
performing a thermal radical oxidation process to oxidize a remaining non-oxidized portion of the formed amorphous silicon layer by exposing the formed amorphous silicon layer directly to oxygen radicals.

9. The method of claim 8, wherein the substrate comprises crystalline silicon.

10. The method of claim 8, further comprising:
forming an interfacial layer on the substrate, wherein the interfacial layer comprises silicon oxide and has a thickness of between 2 Å and 20 Å.

11. The method of claim 8, wherein the forming of the amorphous silicon layer comprises exposing the substrate to a silicon precursor in an atomic layer deposition (ALD) process or in a chemical vapor deposition (CVD) process.

12. The method of claim 8, wherein the amorphous silicon layer has a thickness of between 20 Å and 50 Å.

13. The method of claim 8,
wherein the thermal oxidation process comprises exposing the substrate to oxygen radicals.

14. The method of claim 8, wherein the direct oxidation process comprises directing oxygen plasma ions to a selected portion of the substrate.

15. A method for forming an oxide layer, comprising:
forming of an amorphous silicon layer on a silicon substrate by exposing the silicon substrate to a silicon precursor in an atomic layer deposition (ALD) process or in a chemical vapor deposition (CVD) process;
performing a direct oxidation process to directly and selectively oxidize only a portion of the formed amorphous silicon layer; and
performing a thermal oxidation process to oxidize a remaining non-oxidized portion of the formed amorphous silicon layer to form an oxide layer on the silicon substrate by exposing the formed amorphous silicon layer directly to oxygen radicals.

16. The method of claim 15, further comprising:
forming an interfacial layer on the silicon substrate prior to the forming the amorphous silicon layer on the silicon substrate.

17. The method of claim 16, wherein the interfacial layer comprises silicon oxide and has a thickness of between 2 Å and 20 Å.

18. The method of claim 15, wherein the amorphous silicon layer has a thickness of between 10 Å and 40 Å.

19. The method of claim 15, wherein the thermal oxidation process comprises exposing the silicon substrate to oxygen radicals.

20. The method of claim 15,
wherein the direct oxidation process comprises directing oxygen plasma ions to a selected portion of the silicon substrate.

* * * * *